(12) United States Patent
Jakob et al.

(10) Patent No.: US 7,482,249 B2
(45) Date of Patent: Jan. 27, 2009

(54) METHOD AND DEVICE FOR MACHINING A WAFER, IN ADDITION TO A WAFER COMPRISING A SEPARATION LAYER AND A SUPPORT LAYER

(75) Inventors: Andreas Jakob, Starnberg (DE); Klaus-D. Vissing, Morsum (DE); Volkmar Stenzel, Thedinghausen (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 496 days.

(21) Appl. No.: 10/536,725

(22) PCT Filed: Nov. 28, 2003

(86) PCT No.: PCT/EP03/13434

§ 371 (c)(1),
(2), (4) Date: Nov. 18, 2005

(87) PCT Pub. No.: WO2004/051708

PCT Pub. Date: Jun. 17, 2004

(65) Prior Publication Data

US 2006/0166464 A1    Jul. 27, 2006

(30) Foreign Application Priority Data

Nov. 29, 2002  (DE) ............... 102 56 247
Nov. 14, 2003  (DE) ............... 103 53 530

(51) Int. Cl.
*H01L 21/00* (2006.01)

(52) U.S. Cl. ............ 438/460; 438/461; 438/464

(58) Field of Classification Search .......... 438/460–464
See application file for complete search history.

(56) References Cited

U.S. PATENT DOCUMENTS

| | | | | |
|---|---|---|---|---|
| 4,906,544 A | * | 3/1990 | Osawa et al. | 430/58.1 |
| 4,913,993 A | * | 4/1990 | Osawa et al. | 430/58.1 |
| 4,913,994 A | * | 4/1990 | Osawa et al. | 430/58.1 |
| 4,939,054 A | * | 7/1990 | Hotomi et al. | 430/58.1 |
| 4,950,571 A | * | 8/1990 | Hotomi et al. | 430/58.1 |
| 5,268,065 A | | 12/1993 | Grupen-Shemansky | |
| 2003/0175525 A1 | | 9/2003 | Wochnowski | |
| 2004/0041269 A1 | * | 3/2004 | Ohnishi | 257/758 |
| 2004/0104272 A1 | | 6/2004 | Figuet | |
| 2005/0150589 A1 | * | 7/2005 | Amos et al. | 156/209 |
| 2006/0166464 A1 | * | 7/2006 | Jakob et al. | 438/460 |

FOREIGN PATENT DOCUMENTS

| | | |
|---|---|---|
| EP | 0 252 739 | 7/1987 |
| EP | 0 981 156 A2 | 8/1999 |
| JP | 05343376 | 12/1993 |
| JP | 07106285 | 4/1998 |
| JP | 2002316500 | 10/2002 |
| WO | WO 99/48137 | 9/1999 |

* cited by examiner

*Primary Examiner*—Laura M Menz
(74) *Attorney, Agent, or Firm*—Roylance, Abrams, Berdo & Goodman L.L.P.

(57) ABSTRACT

A process and an apparatus are described for the treatment of wafers, in particular for the thinning of wafers. A wafer with a carrier layer and an interlayer arranged between the carrier layer and the wafer is also described, in which the interlayer is a plasmapolymeric layer that adheres to the wafer and adheres more strongly to the carrier layer than to the wafer.

10 Claims, 6 Drawing Sheets

METHOD AND DEVICE FOR MACHINING A WAFER, IN ADDITION TO A WAFER COMPRISING A SEPARATION LAYER AND A SUPPORT LAYER

FIELD OF APPLICATION

A first aspect of the present invention relates to processes and apparatus for the treatment of wafers. These processes and apparatus are intended to facilitate the fabrication in a thinner format of the wafers used in the production of semiconductor products. In this connection the wafers should preferably be able to be treated more reliably and/or the necessary fabrication expenditure in the production of semiconductor components and/or circuits and/or sensors and/or other semiconductor products should be reduced and/or made more cost-effective and/or the use of laser cutting methods should be permitted or facilitated and/or, in particular, the coating and/or structuring of the rear side of the thinned wafer should be permitted or facilitated and/or the danger of fracturing and/or mechanical damage should be reduced.

A further, closely related aspect of the invention relates to wafers with an interlayer and a carrier layer (covering layer). The first aspect of the invention will first of all be described in detail hereinafter, followed separately by a description of the second aspect.

PRIOR ART (FIRST ASPECT OF THE INVENTION)

The procedure in the production of thin wafers and/or thin semiconductor components differs as a rule from user to user. In general however the following procedure is adopted. In the production of electronic components and circuits (diodes, transistors, ICs, sensors, etc.) components such as for example structures, layers, etc. are applied to wafers (discs of silicon, GaAs or other semiconductor materials and substrates) by means of various technologies. At the present time these wafers are, after completion of the fabrication steps necessary for this purpose, provided on the front side (active side, i.e. side on which the applied components are located) with a protective film or some other protective layer (such as for example a glass plate contacted by means of wax). The purpose of this film or layer is to protect the front side of the wafer and thus the applied electrical and mechanical structures during the subsequent thinning procedure of the wafer (by grinding, lapping, cutting, etching etc. the rear side). After application of the film or layer the rear side of the wafer is thinned, whereby the original thickness of the wafer is reduced. The remaining residual thickness is always governed by the mechanical stresses to be expected in the subsequent process steps, which have to be overcome without any significant increase in the danger of fracture or some other mechanical damage. After the thinning step the rear side of the wafer can be subjected to a mechanical and/or chemical treatment in order to improve the fracture properties of the wafer. After possible cleaning steps the protective film or carrier layer is stripped off and removed from the front side of the wafer. Possible further fabrication steps and/or measures to improve the mechanical properties, and/or investigations, may now be carried out. In many cases the rear side of the thinned wafer is now coated and/or structured with a metallic layer and/or layers. This coating is in most cases carried out by means of sputtering, similar deposition processes in vacuo and/or lithographic processes and in many cases involves a thermal stress and/or thermal assistance. Following on the processes on the rear side (rear side coating and/or rear side structuring) the protective film on the front side or the applied layer composite is removed. Following this the wafer is then in many cases placed with the rear side facing downwards (active front side facing upwards) on a sawing film (expansion film or frame). Finally the wafer is sawn (division of the wafer into separate structural parts) by means of rotary separating discs or other mechanical sawing devices. In individual cases laser separation methods are already also used in this connection. In individual cases wafers are also fractured by this procedure, supporting methods involving scoring being used in individual cases, or the wafer is divided by means of etching processes. With the conventional processes it is very difficult to treat and transport thin wafers without there being an increased danger of fracture or some other damage. These difficulties result inter alia from the fact that after the thinning procedure the wafer has to be subjected to high mechanical stresses in relation to its small thickness. These stresses occur inter alia a) during the stripping or peeling (detachment) of the protective film or protective layer that protects the front side of the wafer during the thinning procedure,
b) during the placing of the wafer on the sawing film,
c) during the transportation between the thinning procedure and the division of the wafer (separation into parts of the wafer, i.e. into dies or chips) and all fabrication steps possibly occurring therebetween. In particular however these stresses occur during the coating of the rear side.

As an alternative to the aforedescribed processes nowadays processes are already employed and/or developed, in which the wafer is already structured on the front side (the structured side) before the thinning process by grinding scored structures and/or scoring and/or chemical etching and/or plasma etching of structures (this term also includes scraping) so that these structures are exposed during the subsequent thinning process by means of mechanical and/or chemical methods, thereby resulting in a division of the wafer. In this connection it is very often a disadvantage however that the now divided parts of the wafer (dies) can no longer be handled economically during the subsequent process steps. This is due to the fact in this case that the large number of already divided components have to be fixed so that they do not become detached and/or change their position during the fabrication steps that have to be carried out.

DISADVANTAGES OF THE PRIOR ART (FIRST ASPECT OF THE INVENTION)

With the present conventional processes it is very difficult and in some cases impossible to coat economically the thinned wafers or the already divided parts of the previously thinned wafer (dies) on the rear side of the wafer. Insofar as this is currently achieved, large fabrication losses occur due to wafer fracture and/or other types of damage, and/or considerable manual measures are necessary in order to avoid such damage. In this connection, at the present time the wafers and/or the divided wafer parts generally have to be handled manually in a very complicated and/or very careful manner and/or by complicated equipment. The difficulty in this connection is due in particular to the extremely thin material thickness of the wafer and/or the large number of possibly already divided wafer parts.

OBJECT OF THE INVENTION (FIRST ASPECT OF THE INVENTION)

The first aspect of the invention is based on the object of providing a process and an apparatus for treating a wafer that enables the fabrication sequence after the thinning of the wafer to be simplified, organised more economically, and that facilitates the treatment of thin wafers, in particular as regards the coating of the rear side. In addition the invention should enable the wafer to be handled more securely and economically during the process steps involving the thinning, the coating of the rear side and the division, and all fabrication steps occurring therebetween. The danger of fracture of the wafer should in particular thereby be reduced.

ACHIEVEMENT OF THE OBJECT (FIRST ASPECT OF THE INVENTION)

The above object is achieved by a process for the treatment of a wafer that carries components on one side (front side), comprising the following steps:
  application of a layer system to the front side of the wafer, wherein the layer system includes at least one interlayer in contact with the front side of the wafer, and a carrier layer,
  thinning of the rear side of the wafer so that the layer system protects or carries (holds) the wafer or parts of the wafer during the thinning.

The wafer, which may also be a wafer that has been structured on the front side of the wafer (the structured side) already before the thinning process by means of grinding and/or scoring and/or chemical etching and/or plasma etching of grooves and/or other structures so that these structures are exposed during a subsequent thinning process by means of mechanical and/or chemical methods (e.g. etching), thus leading to a division of the wafer, is coated on the front side with an interlayer before the thinning (removal of material on the rear side). This interlayer is in this connection preferably applied by means of chemical vapour deposition (CVD) methods. This interlayer may for example be a plasmapolymeric coating, such as has been developed at the Fraunhofer Institut für Fertigungstechnik und Angewandte Materialforschung in Bremen. It is possible for the interlayer to be formed in its full thickness by the CVD process and/or by another vacuum technology process and/or to be assisted and/or achieved by (optionally prior) application of a suitable material. Preferably in this connection interlayer thicknesses of 1 to 1000 nm, more preferably 50 to 200 nm, are adjusted. The layer thickness may however also be smaller or larger. The adhesion properties of the interlayer can in the case of the plasmapolymeric coating applied by means of CVD processes be individually adjusted on both sides by process technology matching. The interlayer should on the one hand facilitate the subsequent peeling of an adjoining layer (carrier layer) from the wafer surface. The interlayer should however also exert a sufficient bonding force (by means of adhesion and/or other bonding forces) between the wafer surface and the adjoining carrier layer for the subsequent process steps and/or should assist and/or permit this. This bonding force may also result in part from the property of the surface topography of the wafer surface. The latter is in particular important if occurring shear forces have to be compensated, e.g. in the mechanical processes of thinning by means of grinding or other suitable methods. A constituent of the wafer can, as is understood by the term wafer within the scope of the present application, also be a passivating layer on the front side of the wafer, and more especially preferably if the wafer includes electronic components. Such a passivating layer (if present) is preferably located directly in contact with the layer of the wafer that carries the electronic components.

A process according to the invention with the following additional step is preferred: coating of the thinned rear side of the wafer so that the optionally structured layer system arranged on the front side protects or carries the wafer or parts of the wafer during the coating.

A process according to the invention having the following (additional) measure is particularly preferred: division of the wafer, in which the (front side) layer system protects or carries the wafer or parts of the wafer during the division, whereby the division is carried out as a separate step or is effected by the thinning, and the layer system is separated or not separated in the division.

Within the scope of the present application the term division is understood to mean the separation of the wafer into parts of the wafer (dies).

The thinning may for example be carried out chemically (etching) and/or mechanically in the process according to the invention.

A process according to the invention having the following additional step is preferred: smoothing of the rear side of the wafer so that the mechanical properties of the wafer are altered, preferably in such a way that the division of the wafer is effected or promoted and/or the coating of the thinned rear side of the wafer is promoted. The smoothing may in this connection be carried out by chemical or physical etching (e.g. plasma etching) or by mechanical polishing, and reduces the danger of wafer fracture.

An aforedescribed process according to the invention with the following additional step before the fabrication of the layer system on the front side of the wafer is preferred:
  (pre-)structuring of the wafer by grinding and/or scoring and/or chemical etching and/or physical etching, so that the formed structures open during the thinning of the rear side or during a subsequent treatment of the rear side and divide the wafer.

Also preferred is an aforedescribed process according to the invention in which (a) a laser beam or (b) a mechanical method, preferably abrasive cutting, sawing or breaking, is used to divide the wafer. In this connection variant (b) in particular is preferably used for wafers that are not pre-structured for the separation.

In a further preferred process according to the invention the following step is included after the division:
  Reduction of the adhesion (a) of the layer system to the wafer, or (b) of the carrier layer to the layer of the layer system adjacent to the wafer side, preferably the interlayer. The purpose of this procedure is in particular to permit the removal of the divided parts of the wafer by means of a vacuum device or another mechanical removal device, in which particularly preferably so-called Blue Tape does not have to be applied to the rear side of the wafer.

Preferably in this connection the reduction of the adhesion in the case (a) of the layer system or in the case (b) of the carrier system is achieved by (i) irradiation with electromagnetic radiation, (ii) thermal action, (iii) chemical action and/or (iv) mechanical action. The thermal action may in this connection consist of heating or cooling, or both.

In this connection a process according to the invention is preferred in which the interlayer is mechanically detached from the carrier layer or the wafer or the parts of the wafer.

Also preferred is a process according to the invention in which the interlayer of the layer system is applied by vacuum technology. The interlayer is preferably a layer as is described in DE 100 34 737 C2; the interlayer is preferably a plasmapolymeric stripping layer whose properties are adjusted so that in the region of the desired separation surface (i.e. the surface along which the separation should take place) it adheres less strongly to the adjoining layer than it does to the other adjoining layer. These adhesion properties can be achieved by matching the interlayer to the adjoining layers (i.e. in the general case the wafer and the carrier layer). This is preferably achieved by forming the interlayer as a plasmapolymeric gradient layer. It is particularly preferred in this connection if the desired separation surface runs along the contact surface of the interlayer and wafer, which means that the interlayer adheres less strongly to the wafer than to the carrier layer.

After application of the interlayer a further layer is applied as carrier layer. This is preferably a plastics composition (e.g. polymer) that is preferably applied by means of liquid application (e.g. by a spincoater). The carrier layer may however also consist of a photosensitive coating, ceramics material, metal, adhesive and/or soluble and/or organic and/or inorganic substances and/or a layer composite and/or a mixture of the aforementioned materials.

In a further preferred modification of the process according to the invention the carrier layer is hardened by means of heat or irradiation with light.

In this connection the carrier layer renders superfluous the application of an otherwise conventional film, as is applied according to the processes of the prior art normally before the subsequent thinning (grinding, abrasive cutting or similar processes for thinning wafers) to the front side (structured side) of the wafer for its protection. If necessary and/or convenient the applied carrier layer can be levelled and/or smoothed by mechanical smoothing and/or rotation, for example by spincoating and/or by the use of other expedient and/or necessary processes. The layer may at the same time and/or subsequently be hardened and/or melted by thermal and/or other suitable or necessary processes, e.g. by UV and/or IR radiation.

It may be advantageous to match the properties of the layer system and in particular of the carrier layer for the purpose of a subsequent division of the wafer by means of a laser as regards its properties, to the use of laser beams as regards its optical or other material properties. Thus, an interaction of the layer system and/or its change or damage during the laser separation should be prevented and/or lessened.

The layer system may (for the purposes of the subsequent fixing or holding) have recesses and/or devices and/or mechanical constituents (for fixing or holding) that extend over the surface of the wafer.

For the further reinforcement and/or support and/or facilitation of the subsequent handling the layer may be supported by means of a carrier of glass, metal and/or other suitable organic and/or inorganic materials and/or a mixture of the aforementioned materials and/or of a layer composite consisting thereof. In this connection sheets such as for example grinding sheets and/or abrasive sheets may also be used.

The applied layer system (which comprises at least the interlayer and the carrier layer) should carry and/or protect the wafer surface during the subsequent processes, handling and transportation and, if necessary, should fix already divided components (wafer parts) until their desired removal and/or stripping. In this connection it is possible, in particular by adjusting the layer properties and material properties and/or the layer thickness, to adjust the layer so that it exhibits further advantages or matching properties. Thus, the flexibility, adhesion and/or the damping properties of the layer can be influenced and adjusted. In this connection it may be advantageous purposefully to embed and thereby protect the surface topography of the wafer. This may prove advantageous in particular with already bumped-up wafers, since in this way the projecting contacts are mechanically protected and in the subsequent thinning by means of grinding and/or abrasion the in general undesired penetrative forcing of the contacts is thus reduced or completely suppressed.

The applied layer system has several functions, some of which have already been disclosed in the preceding description. The layer system protects the front side of the wafer against mechanical and/or chemical or plasma technology damage during the thinning, reduces the mechanical stresses that are caused by the subsequent handling and transportation of the wafer, protects the front side of the wafer against impurities, serves as a sawing film, and is intended in particular to simplify the coating of the rear side. In this connection it is however unimportant whether the rear side coating process takes place before or after the division, or is omitted entirely.

It may be advantageous to choose the material of the carrier layer so that it undergoes very slight or no reactions at all in vacuo, for example due to outgassing. For coating processes it is advantageous if the carrier layer material that is used has a high thermal conductivity and thus permits the selective heating of the wafer, or the heat of the wafer is selectively dissipated. This property may be achieved for example by the addition of suitable fillers. Furthermore it is often advantageous to choose the carrier layer material so that it is matched as regards its behaviour under temperature fluctuations to the wafer material, for example by choosing the wafer material and carrier layer material so that they have very similar coefficients of thermal expansion (ratio of the coefficient of thermal expansion of the carrier layer to the coefficient of thermal expansion of the wafer is preferably in the range from 0.9 to 1.1).

If the wafers are sufficiently thin, then it may be advantageous and/or necessary to separate them by means of a laser and/or other suitable mechanical methods such as e.g. abrasive cutting and/or sawing and/or etching processes. In this connection the wafer is preferably transilluminated by means of suitable optical methods (preferably in the infrared spectrum and for the purpose of positioning (alignment—exact straightening of the wafer so that the components can be separated with the greatest possible accuracy)), so that structures and markings (sawing lines) provided for this purpose can be recognised. After the straightening of the wafer and/or separating device the separation procedure is initiated. In this connection preferably a laser and/or another suitably designed sawing and/or separating device moves over the structures, contours and/or lines provided for the cutting, and cuts (separates) them, in the case of a laser by means of its beam. This procedure is monitored and optionally finely adjusted by suitable devices such as optical, electrical or mechanical measurement and regulating devices. During or after the separation of the wafer it is envisaged and possible that the particles, gases and dust that are formed are removed, blown off, suctioned off or washed off by means of suitable devices. An etching process may however also be used for the separation.

If the thinned rear side of the wafer is subjected to a metallization and/or rear side structuring, it may be advantageous to carry this out even before the division of the wafer. In this way coatings and/or damage on the separation edges that would otherwise be exposed can be avoided. For the purposes of stabilisation and/or support it may be advantageous to hold or fix the wafer together with the described carrier layer by means of a further layer and/or carrier.

The invention also enables the wafer or the composite of parts of the wafer already divided at this particular time to be processed in a vacuum for the purpose of coating the rear side. Thus, it is in particular possible in this connection to apply metallic layers in vacuo by means of sputtering, vapour deposition and/or other suitable methods. In this connection temperatures of over 300° C. are possible during the coating.

A process according to the invention is preferred in which the layer system includes a layer that is arranged on the side of the carrier layer facing away from the wafer and (a) is in the form of a film or (b) is in the form of a composition of inorganic and/or organic material.

After completion of the envisaged treatment steps it may be necessary or advantageous to strip off the applied carrier layer again. Preferably for this purpose a (further) film (e.g. Blue Tape) is applied to the rear side of the wafer and the carrier layer applied to the front side is then removed. When stripping of this layer it may be advantageous to use for this purpose mechanical devices that facilitate the removal. In particular however the interlayer situated between the surface of the wafer and the carrier layer facilitates the stripping of the carrier layer and/or divided components. In this connection it is possible to adjust the individual adhesion properties of both sides of the interlayer independently of one another so that the separation takes place specifically on one of the two sides of the interlayer or is suppressed. In the separation the interlayer can thus either remain on the wafer surface or can be removed together with the carrier layer. Alternatively however it may also be convenient and/or desirable to lift off and/or peel off the divided parts of the wafer directly from the carrier layer. In order to reduce the bonding forces or adhesion properties of the carrier layer it may be advantageous and/or desirable to reduce the bonding forces and/or adhesion property by means of suitable methods such as irradiation with UV or IR light, thermal treatment and/or other suitable methods.

A process according to the invention is preferred in which the thinning of the rear side of the wafer is carried out by (i) abrasion, (ii) lapping, (iii) wet chemical etching and/or (iv) plasma etching. Abrasion may in this connection be grinding for example.

A process according to the invention comprising the following steps is particularly preferred:
a) application of a layer system to the front side of the wafer, with an interlayer contacting the front side of the wafer, and a carrier layer,
b) hardening and/or consolidation of the carrier layer,
c) thinning of the rear side of the wafer,
d) smoothing of the rear side of the wafer so that the mechanical properties of the wafer are altered, preferably in such a way that the division of the wafer is effected or promoted and/or the coating of the thinned rear side of the wafer is promoted,
e) coating of the thinned rear side of the wafer, in which the layer system protects or carries the wafer and/or parts of the wafer during the coating,
f) division of the components of the wafer, in which the layer system protects or carries the wafer and/or parts of the wafer during the coating and the layer system is not separated during the division, and
g) preferably mechanical detachment of the interlayer from the carrier layer or from the wafer or from the (already divided) parts of the wafer.

Particularly preferred is a process according to the invention in which the layer system is applied so that the interlayer adheres to the front side of the wafer and adheres more strongly to the carrier layer than to the wafer.

The invention also relates to an apparatus for the execution of the process according to the invention. Preferably the apparatus is a unit, a unit system or consists of units connected to one another. In the apparatus there are preferably connected to one another devices for the application of the interlayer, for the application of the carrier layer, for the treatment of the applied layers, for the thinning and for the division of components. A preferred apparatus for carrying out the process according to the invention includes:

means for the application of a layer system to the front side of a wafer, in which the layer system comprises at least an interlayer contacting the front side of the wafer, and a carrier layer, and means for thinning the rear side of the wafer provided on the front side with the layer system, which means are designed so that the layer system protects or carries the wafer and/or parts of the wafer during the coating, as well as optionally:

means for coating the thinned rear side of the wafer, which means are designed so that the layer system protects or carries the wafer and/or parts of the wafer during the coating, and/or means for dividing the components of the wafer, which means are designed so that the layer system protects or carries the wafer and/or parts of the wafer during the division, in which the division is carried out as a separate step or is implemented by the thinning, and the layer system is separated or not separated during the division, and/or means for the structuring of the wafer by grinding and/or scoring and/or chemical etching and/or physical etching, which means co-operate with other constituents of the apparatus so that the structures that are formed open during the thinning of the rear side or during a subsequent treatment of the rear side and divide the wafer, and/or means for reducing the adhesion (a) of the applied layer system to the wafer or (b) of the carrier layer to the adjacent layer of the layer system on the wafer side, preferably the interlayer, and/or means for the detachment of the wafer or of parts of the wafer from the layer system.

Preferred constituents of the apparatus according to the invention are a coating device for the application of the interlayer and/or the carrier layer (protective or covering layer) or of combinations of layer(s) and/or layer systems to the front side of the wafer, a device for the application of a coating to the rear side, a device for thinning the wafer, a device for dividing the wafer parts (dies), which may consist of a laser or a laser-assisted separating implement and/or a mechanical separating implement, a device for reducing the adhesion of the carrier layer to the front side of the wafer (optionally together with the interlayer) after the division, and a device for stripping the components from the layer.

ADVANTAGES OF THE INVENTION (FIRST ASPECT OF THE INVENTION)

The invention enables advantages that are significantly more technological to be achieved in the fabrication and handling of wafers for the production of electronic components, ICs, sensors, etc. The fabrication is simplified and made more cost-effective with the process according to the invention and the apparatus according to the invention. In addition smaller wafer thicknesses can be achieved in a simpler, more economical and more reliable manner.

Advantages superior to the carrier solutions currently employed (carriers in the form of films or other layer systems, e.g. of glass in combination with wax) are achieved, in particular with processes for coating the rear side of thin wafers, especially if these coating procedures take place in vacuo and/or are performed under thermal stress. In this connection the handling of the thin wafers or the already divided components is simplified by virtue of the fact that the applied carrier layer fixes and/or mechanically supports the wafer and/or the divided wafer parts. If the wafer surface has adequate topographical properties, the divided parts of the wafer are also thereby fixed. This effect can also be achieved and/or assisted if a structuring of the front side of the wafer surface has been carried out for the purposes of the division. As a consequence the interlayer as well as the carrier layer are then in fact incorporated into the resultant structures and a mechanical anchoring of the subsequently divided wafer parts is achieved.

A further advantage is that an applied (to the front side) layer system can protect the topography of the wafer surface very well and indeed better than the films currently used for this purpose. The undesirable penetrative forcing of projections on the wafer surface can thereby be reduced or even excluded during the mechanical thinning process.

A further advantage is that the layer system can be applied by means of vacuum processes and/or lacquering processes (e.g. spincoating). Processes for the application and/or stripping of films of carrier materials can thus be avoided.

In addition the divided parts of the wafer can, on account of the fact that the (preferably not separated) layer system of interlayer and carrier layer is a composite, be processed and handled like a normal monolithic wafer. The layer system may in this connection also perform the function of a transporting means and serve for the shipment between the manufacturer and subsequent customers and users.

However, the increased vacuum-technology and thermal compatibility of a layer system to be applied in accordance with the invention compared to the use of films or the like is of outstanding importance.

EXAMPLE 1 (FIRST ASPECT OF THE INVENTION)

In the following description it is assumed that the wafer has already passed through the fabrication steps involving the application of the components, i.e. in particular the electric components, and/or the mechanical structuring or coating procedures.

The front side of the wafer is coated by means of a CVD process with a ca. 100 nm thick plasmapolymeric layer, which being a constituent of a layer system consequently covers the active surface (front side) of the wafer. In this connection it has individually matched adhesion properties on both sides, and serves as interlayer. For example, in this connection the adhesion properties are adjusted so that the bonding of the interlayer to the front side of the wafer is very slight and the bonding of the interlayer to the carrier layer (to be applied in a following step) is high; the adhesion properties may however also be adjusted in the reverse way.

A plastics composition of polyamide, optionally enriched with a filler, is next applied as carrier layer by means of spincoating and is then consolidated under the action of heat.

The rear side of the wafer is now thinned by means of grinding and then chemically etched to rectify surface damage. Following this the rear side of the wafer is coated with metal by means of sputtering in a vacuum plant. During this procedure the wafer heats up to ca. 350° C., without however the layer system being destroyed. Finally the wafer is straightened by means of an optical process using IR radiation and divided from the rear side by means of a laser beam. After completion of the division the rear side is coated with a film (Blue Tape) and the carrier layer together with the interlayer on the front side is stripped off. The divided wafer parts are now removed from the film by a pick and place procedure and contacted.

Oferriew of Preferred Modifications

Further preferred modifications of the first aspect of the invention are disclosed in the following part of the description and in the relevant claims.

A process is preferred for the treatment of wafers with components during the thinning of the wafer and the subsequent division of the components and the fabrication steps optionally occurring therebetween, in which the front side of the wafer together with the components is coated, before the thinning, with a layer system that consists at least of an interlayer and a carrier layer, in which the wafer and/or the already divided components are protected and/or held during the coating of the rear side of the wafer, by the layer system applied to the front side.

In contrast to this the aforedescribed process is preferred, in which a laser beam is used to divide the components or alternatively a process is used in which a mechanical method such as abrasive cutting, sawing and/or fracturing is used to divide the components.

Preferably in a process according to the invention the wafer is protected during the thinning by the layer system applied to the front side of the wafer.

Preferably in a process according to the invention the wafer is protected during the division of the components by the layer system applied to the front side of the wafer.

Moreover, in a process according to the invention the interlayer is preferably a layer applied by vacuum technology, in which again the carrier layer preferably consists of a plastics composition and again the carrier layer is preferably applied by means of a spincoater.

A process according to the invention is preferred in which the carrier layer is hardened by means of heat.

A process according to the invention is preferred in which the carrier layer also performs the function of a carrier.

A process according to the invention is preferred in which the carrier layer is a layer system comprising several layers.

Also preferred is a process according to the invention in which a cleaning and/or chemical treatment to improve the fracture properties of the wafer is carried out on the rear side of the wafer between the thinning of the wafer and the division of the wafer.

Also preferred is a process according to the invention in which the adhesion of the carrier layer is reduced for the purposes of the removal and/or stripping of the parts of the wafer.

Also preferred is a last-described process in which the adhesion of the carrier layer is reduced by irradiation with electromagnetic waves, by heating, chemical action and/or by mechanical action.

Also preferred is a process according to the invention comprising the steps:

a) coating the front side of the wafer, in which the components are arranged, with an interlayer, b) coating of a carrier layer on the front side of the wafer, c) hardening and/or consolidation of the carrier layer, d) thinning of the wafer from its rear side to a desired thickness, e) treatment of the rear side of the wafer by means of chemical and/or mechanical processes for the purposes of improving the mechanical properties and improving the thinned wafer, f) coating of the rear side of the wafer with a layer, g) division of the wafer, in which the carrier layer is not separated, h) reduction of the adhesion of the carrier layer to the parts of the wafer, and preferably the steps e) to h) may be carried out in any sequence and/or individual steps or all of these steps may be omitted.

A process according to the invention is preferred in which the wafer is already structured by means of grinding and/or scoring and/or chemical and/or physical etching processes before the application of the interlayer and/or the application of the carrier layer, so that these structures open and the wafer is thus divided during the thinning and/or the subsequent treatment of the rear side.

Also preferred in many cases is a process according to the invention in which the separating process is omitted.

Preferably in a process according to the invention the thinning is carried out by grinding, lapping, wet chemical etching and/or plasma etching.

A process according to the invention is preferred in which a further layer in the form of a film is applied after the application of the carrier layer, and/or in which a further layer in the form of an inorganic and/or organic composition is applied after the application of the carrier layer.

A preferred apparatus for the implementation of a process according to the invention comprises:

a) a coating device for the application of the interlayer,
b) a coating device for the application of the carrier layer,
c) a device for thinning the wafer,
d) a device for dividing the components,
e) a device for coating the rear side of the wafer,
f) a device for reducing the adhesion of the carrier layer to the interlayer,
g) a device for stripping the components from the carrier layer.

The first aspect of the invention is illustrated in more detail hereinafter with the aid of FIGS. 1 to 15.

The sequence of the process steps illustrated in the figures is given only by way of example and may deviate from the present or future processes. In particular it may be advantageous to divide the wafer only after the 12$^{th}$ step (metallization of the rear side) by means of the 9$^{th}$ step (laser separation).

In the figures technical details, size relationships and dimensions are given only by way of example.

The figures show or illustrate the following:

FIG. 9) by means of optical detection devices (for example IR camera 9).

FIG. 15: the subsequent step to the alternative to step 13 according to

FIG. 14: in the further sequence it may be necessary and/or advantageous to strip off the carrier layer. In this connection it may be advantageous to use suitable mechanical methods and/or devices (19). At the same time it may be advantageous and/or necessary to assist the stripping of the carrier layer by suitable chemical and/or physical methods. The interlayer can (depending on the earlier process steps) be intentionally removed from the wafer when peeling off the carrier layer (not shown diagrammatically) or can intentionally be left on the wafer (shown diagrammatically).

EXAMPLE 2

It is preferred if the wafer to be thinned and divided has, within a fabrication process for the production of ICs, transistors, diodes, sensors, etc., already passed through the majority of the fabrication steps for the application of the electrical and mechanical structures (components) and layers. The wafer is now covered or coated on the upper side (the active side, i.e. the side on which the structures are situated) with an interlayer and/or a carrier layer. The layer and/or the layer composite with the wafer arranged thereon is fixed on a carrier, for example by means of a film, and/or is held in situ by means of a vacuum suction device. Following this the wafer is fed into a unit system. The treatment process for thinning the wafer then takes place. In this way the thickness of the wafer is reduced by means of known methods such as for example grinding, lapping and/or etching.

The wafer can be cleaned during or following this process step. In addition a chemical treatment in order to improve the fracture properties is possible. After completion of this process step the wafer is moved on within the unit system and passed for example to a separating device. It should be noted that one or also several unit components can be combined for the thinning and one or also several unit components can be combined for the separation. The wafer is passed to the separating device without the layer or the layer system applied to the front side having been removed. In this connection a device for the transportation and for the purposes of the subsequent expansion of the layer or layer system may be attached to the edge and/or underneath the layer or underneath the layer system.

The wafer is now straightened with respect to the separating device by means of a suitable optical and/or mechanical system. In this connection a process involving infrared illumination or transillumination may preferably be employed. The wafer at this particular time is still arranged with its front side on the layer or layer system. After straightening the wafer the rear side of the wafer is now sliced through or divided, for example with the aid of a laser beam. The laser is preferably guided by a very thin water jet of about 25 µm diameter. The laser beam moves in the interior of the water jet and is totally reflected at the internal wall of the water jet, so that scattering losses are avoided.

It is envisaged that for example the layer or the layer system is sufficiently porous to cover the front side of the wafer, so that the water jet passes through it without however damaging it. At the same time the layer and/or the layer system remain intact and the divided components retain their position on the film. A mechanical device may however also be used for the separation, for example for the abrasive cutting and/or sawing and/or fracturing.

This may then be followed by a cleaning process inside or also outside the unit system. The unit system may also include a unit or apparatus for the purposes of the mechanical and/or chemical coating of the rear side of the wafer. In this connection vacuum technology processes and units in particular are involved, by means of which in particular metallic layers can be applied by means of for example sputtering and/or vapour deposition and/or other methods. In this case it is envisaged that the coating of the rear side can take place before and/or after the separation procedure. Furthermore the unit system can be expanded by a component for the removal of the now divided electrical components. It is also envisaged that the separated wafer plus carrier and lacquer layer or film or without such a layer can be inserted in a cassette system.

If a wafer without a carrier layer is to be inserted, a device for the separation from the carrier layer is provided in the unit system. Preferably the interlayer consists of a nitride layer applied by means of a CVD process. However, other layers and/or layer systems may specifically also be used. Preferably the carrier layer consists of a plastics material with good adhesion properties. The joining of the carrier layer to the wafer is preferably effected by adhesion of the interlayer. If the joining of the carrier layer to the wafer is effected substantially by adhesion, the carrier layer can be stripped off by heating by means of electromagnetic radiation (e.g. IR or UV radiation) or by applying heat.

The second aspect of the invention is technically closely related to the first aspect; it is however discussed separately on account of its important economic significance.

The second aspect of the invention relates to a wafer with a carrier layer (covering layer) and an interlayer arranged between the carrier layer and the wafer, a process for the production of such a wafer, a process for thinning a wafer, and a process for metallizing the rear side of a wafer.

Prior Art/starting Position (Second Aspect of the Invention)

It is often necessary for technical reasons to cover surfaces temporarily in order to protect them for transportation or the next processing steps. A widely employed method consists for example of covering automobile parts with an adhesive film in order to protect the paintwork during transportation to the customer, or temporarily to provide vehicles with promotional material. In addition temporary covering films are widely used in painting operations (touch-up paintwork) in order to cover areas around repair sites.

In the production of semiconductor components (dies) adhesive films (e.g. so-called grinding films or Blue Tapes) are nowadays likewise used in many cases to provide temporary coverage on wafers in order to be able to simplify the handling involved in the rear side treatment or for the separation (division by cutting), and also in particular to protect the front side of the wafer, on which the actual electronic components are situated.

Developments in the semiconductor production sector are currently aimed at greatly reducing the thickness of (thinning) the silicon wafer and thus the carrier of the actual electronic components and circuitry after its production. In this connection thicknesses of less than 40-50 µm can nowadays be achieved. The multifarious advantages resulting from such a procedure, although very far-reaching, will not be discussed in more detail here. However, by way of example it may be mentioned that with a smaller thickness of the wafer—and thus also of the chips (dies) separated therefrom—the undesirable cross-talk between the electronic components within the chip as well as the substrate noise can be effectively reduced by for example metallizing the rear side. This effect is based inter alia on the fact that, with decreasing thickness of the silicon layer, the internal resistance of the silicon layer also decreases. In addition a thin wafer has a higher thermal conductivity than a thick wafer, which is desirable for the subsequent use.

Disadvantages of the Prior Art (Second Aspect of the Invention)

However, a small thickness provides not only advantages but also causes difficulties, especially in the further processing of the wafers: a greatly thinned wafer becomes increasingly fragile and bends due to stress in the function coating. In addition it still has only a very low thermal capacity, which leads to serious difficulties and challenges for the subsequent treatment steps. This affects in particular the rear side metallization, for which temperatures of about 370° to 380° C. have to be employed, and in addition a vacuum compatibility of the wafer to be coated has to be ensured. The greatly reduced mass and thus the likewise greatly reduced thermal capacity of the wafer means that the electrical circuits are significantly more highly loaded due to the high metallization temperatures.

In addition the handling of very greatly thinned wafers in conventional highly automated processes represents a challenge from the aspect of the mechanical stresses and further processability in existing handling equipment.

Up to now there has been no industrially implemented and satisfactory way of being able to provide a greatly thinned wafer with a rear side metallization, since all types of hitherto known carrier films break down on account of the necessary high metallization temperature.

Wafer surfaces that are provided with a protective layer of silicon nitride and/or silicon dioxide or polyimide are nowadays mainly used as surfaces to be coated. In principle however also other materials are not excluded. Moreover the surfaces are as a rule structured by electrical circuits or in addition by a "dicing" process, by means of which the wafers have been prepared for the separation into individual dies.

Processes for the treatment of a wafer are known from the prior art, in which in particular the front side of the wafer is temporarily covered for purposes of protection and/or to simplify handling. Thus, DE 100 29 035 C1 discloses a process for the treatment of a wafer, in which a so-called carrier wafer is applied to the wafer to be treated. The two wafers are joined by means of a connecting layer, which is partially inserted into holes in the carrier wafer and thus rests on the parts of the wafer to be treated that are exposed by the holes. After carrying out treatment steps on the rear side of the wafer to be treated, the carrier wafer is separated once more by removing the connecting layer.

U.S. Pat. No. 5,981,391 discloses a process for producing a semiconductor device that comprises protecting the front side of a wafer by an adhesive medium, as well as the removal of this adhesive medium after treating the rear side of the wafer and heating the wafer after removing the adhesive medium to a temperature that is higher than the thermal decomposition temperature of the adhesive that was provided by the adhesive medium.

WO 99/08322 discloses a coated wafer in which the coating always comprises at least titanium.

WO 99/48137 likewise discloses a wafer provided with a layer, in which the layer is intended to protect the front side of the wafer during subsequent treatment steps. Such a subject matter is also disclosed in DE 198 11 115 A1, wherein in both documents the layer remains on the wafer at least until after the division of the wafer into dies.

U.S. Pat. No. 6,263,566 B1 likewise discloses a wafer with a coating, from which selected regions can be removed again after treatment steps.

All the coatings disclosed in the prior art are still not entirely satisfactory and for example in some cases can be separated again from the wafer only with a great deal of effort. Furthermore the application of the layers is often complicated and the layer material is not optimally matched to the tasks it has to perform.

Object of the Invention (Second Aspect of the Invention)

The object of the second aspect of the present invention was to overcome the aforementioned disadvantages of the prior art. This object is achieved by a wafer with a carrier layer and an interlayer arranged between the carrier layer and the wafer, in which the interlayer is a plasmapolymeric layer that adheres to the wafer and adheres more strongly to the carrier layer than to the wafer. In this connection processes (PECVD or plasma polymerisation for the interlayer and preferably spincoating for the application of the carrier layer) are used that are conventionally employed in the semiconductor industry, and accordingly do not need to be described in more detail here.

A large number of materials can be used as carrier layer for the wafer, and more specifically preferably those that are on the one hand flexible, but on the other hand have a sufficient mechanical hardness in order to be able to exert a protective function. An example are layers of polyimide, which in addition also provide the possibility of applying the layer in a simple way to the wafer and hardening the layer only afterwards (for example thermally). Polyimide is also suitable on account of the fact that it is sufficiently temperature-resistant for the rear side metallization.

According to the second aspect of the invention the interlayer is a plasmapolymeric layer, in which the mode of implementation of the process by which this interlayer was applied is not decisive so long as the composition of the interlayer and the application process are chosen so that the adhesion of the interlayer to the carrier layer is stronger than the adhesion to the surface of the wafer. All methods ranging from direct voltage excitation to microwave excitation are possible. Also, the use of atmospheric pressure plasmas is not excluded.

The production of the plasmapolymeric interlayer is however preferably carried out by the low-pressure plasma polymerisation process. In this procedure the gas composition at the start of the plasma coating process is especially important: too high a residual oxygen content or too high a residual moisture (e.g. from wall deposits) leads to a marked, uncontrolled change of the gas composition and thus to a non-optimal first monolayer of the coating, which however must reproducibly produce the adhesion properties. A non-optimal first monolayer of the coating may also occur if this layer is deposited during the transient phase of the plasma. It is therefore preferred to establish specifically the necessary boundary conditions for the deposition of the first monolayer. This can be achieved for example by sufficient evacuation (two to three powers of ten below the subsequent operating pressure), optionally assisted by freezing out moisture and/or heating the plasma chamber, and/or can be accomplished, in particular also during the transient phase of the plasma, by temporarily covering the wafer to be coated in vacuo (e.g. by means of a movable screen). After the transient phase sufficiently stable conditions prevail since the residual oxygen content and the residual moisture in the reactor are greatly reduced by the plasma process. The adhesion properties of the interlayer to the wafer are obtained if necessary by changing the reaction parameters, for example the gas composition, output and/or pressure. The thickness of the interlayer is preferably 1 to 1000 nm, more preferably 10 to 500 nm and particularly preferably 50 to 200 nm.

Preferably the wafer of the object according to the invention (wafer plus carrier layer and interlayer) consists of optionally doped silicon and in turn preferably comprises on the front side an active layer with electronic components, the interlayer being arranged on the front side. As indicated above the wafer, if it contains an active layer with electronic components, regularly also comprises a passivating layer, which may for example consist of silicon nitride and/or silicon dioxide or polyimide. In this case the interlayer described above is arranged on this passivating layer (as a constituent of the wafer). The front side of the wafer is defined by the position of the active layer with electronic components: the side on which the active layer of the wafer is arranged is termed the front side of the wafer.

A wafer according to the invention (wafer plus interlayer and carrier layer) is preferred in which the interlayer is a gradient layer and/or includes an adhesive zone adjoining the carrier layer and a dehesive zone adjoining the wafer, as well as optionally a transition zone, wherein the adhesive zone and dehesive zone are composed of different substances. In this connection a dehesive zone is the zone that adheres less well to the substrate (without wafer) than does the "adhesive zone" to its relevant substrate (the carrier layer).

Within the scope of the deposition process of the plasmapolymeric interlayer it is possible to control the deposition parameters, for example via the gas composition, so that the interlayer includes an adhesive zone and a dehesive zone. This is particularly useful if the layer of the wafer (for example a passivating layer) that is intended to carry or carries the interlayer has similar or identical adhesion properties as the carrier layer that is used. By suitably choosing the deposition parameters it is possible to adjust accurately the adhesion properties of the adhesive zone and dehesive zone with respect to the layers (carrier layer and carrying layer of the wafer) adjacent to the interlayer.

An interlayer produced by means of low pressure plasma polymerisation is known from DE 100 34 737 C2. However, a plasmapolymeric interlayer is described there, which is characterised (in contrast to the interlayer of the wafer according to the invention) by the fact that it has an excellent adhesion to the metallic substrate (i.e. to the layer to which it was applied), a transition to dehesive properties occurring stepwise during the deposition process. Such an interlayer is typically used to coat metallic moulds in plastics processing in order to be able to dispense with liquid mould release agents. The plastics materials applied to this layer can be removed from the moulds without leaving a residue by suitably matching the interlayer.

Surprisingly, an interlayer that can be used in the wafer treatment can be obtained by means of a deposition process that is carried out in exactly the opposite way to the process described in DE 100 34 737 C2. The deposition conditions for the plasmapolymeric interlayer must therefore be chosen, in contrast to the process according to DE 100 34 737 C2, so that the interlayer with its dehesive zone is deposited first. In this way it is ensured that the separation between the dehesive zone and wafer can take place after application of a carrier layer (to the last deposited adhesive zone of the interlayer).

An object according to the invention (wafer plus carrier layer and interlayer) is preferred, particularly in one of the aforedescribed preferred modifications, in which the interlayer is produced on the wafer side with an initially liquid precursor that subsequently becomes an integral constituent of the overall coating.

A particularly good quality of the dehesive properties of the interlayer can be achieved if the wafer to be coated is thinly wetted with a liquid precursor before being introduced into the vacuum chamber (in the case of a low pressure plasma), which precursor has to satisfy the following requirements:

It should not evaporate into essential parts in vacuo.
It should be a separation-active substance (e.g. a silicone oil such as AK5 to AK50 from Wacker Chemie).

The person skilled in the art will preferably match the liquid precursor to the chemistry of the plasmapolymeric interlayer, and the precursor should preferably be applied so thinly (e.g. 0.1 to 50 nm) that the precursor becomes part of the plasmapolymeric coating due to the subsequent plasma process. It is particularly preferred in this connection if the initially liquid precursor becomes fully integrated into the interlayer. The liquid precursor is applied to the substrate (the wafer) preferably by immersion, spraying or spincoating, and a coating of the rear side of the wafer (that is the side of the wafer lying facing the front side) should be avoided.

The liquid precursor applied in this way is exposed in the first step of the plasma polymerisation to the active constituents of the plasma (electrons, protons, ions, etc.). In this way there normally takes place both a crosslinking of the precursor molecules with one another (preferably to form the polymer chain or a three-dimensional polymer framework), as well as a crosslinking with that layer that is deposited from the gas phase. The initially liquid precursor thus becomes an integral constituent of the plasmapolymeric transfer coating and can therefore also subsequently be removed with this from the wafer.

The person skilled in the art will match the type of liquid precursor and the coating thickness (on the substrate) as well as the subsequent steps of the plasmapolymeric coating to one another in such a way that a large-scale integration, preferably a complete integration, of the initially liquid precursor into the plasmapolymeric coating takes place. This can be checked, for example by measuring the contact angle of the front side of the wafer, after removing the interlayer. Any precursor residues on the front side of the wafer can also be detected by X-ray photoelectron spectroscopy (XPS).

By using such a liquid precursor the total coating time in the plasma can also if necessary be reduced.

An object according to the invention (wafer plus interlayer and carrier layer) is preferred in which the interlayer adheres largely unchanged to the wafer and to the carrier layer at temperatures of up to at least 350° C., preferably up to at least 380° C. and particularly preferably up to at least 400° C. A high temperature resistance is particularly important if steps that involve an increased temperature loading of the layer (e.g. rear side metallization) are planned within the framework of the further treatment of the wafer.

If a liquid precursor was used, this loses its property as a liquid release agent due to the aforedescribed crosslinking. It becomes an integral part of the plasmapolymeric coating. In this way it also achieves a corresponding temperature stability.

An object according to the invention is preferred in which the interlayer can be stripped from the wafer in a substantially residue-free manner. Such an object according to the invention is particularly preferred in which the interlayer can be stripped in a completely residue-free manner. Since the carrier layer is also stripped together with the interlayer from the wafer, it is possible to carry out a large number of further processing steps with a wafer according to the invention (wafer plus interlayer and carrier layer) e.g. rear side metallization, thinning, division into dies, in which the wafer is protected by the carrier layer (and optionally also by the interlayer). By means of an appropriate modification in the carrier layer it is in addition also possible to match the wafer to a planned machine-executed further processing. By stripping the interlayer and carrier layer in as residue-free a manner as possible (particularly important in the regions in which the contacting of electronic components is to take place), after the division the individual dies (chips) can be passed to their evaluation stage without the interfering carrier layer.

Preferred in this connection is a wafer according to the invention in which the interlayer and the wafer can be mechanically detached (e.g. by a peeling process).

After the processing steps the wafer (and the chips produced therefrom) is generally extremely sensitive. For this reason it may be desirable not to subject the wafer to chemical or thermal stress. Since the adhesion forces of the interlayer (as described above) can be influenced in a purposeful manner, these can be adjusted so that the mechanical loading required for the mechanical detachment is still not too high for the wafer or the chips. By means of a suitable process the separation of the wafer into the individual chips can also take place at the same time as the detachment (e.g. if in a preceding step the wafer has been thinned sufficiently after depressions have already been made along the planned separation line in the wafer, e.g. by sawing or by using a laser).

An object according to the invention is preferred in which the carrier layer consists of a polymeric material. Particular requirements are as a rule placed on this material: these include a sufficient temperature stability, preferably up to 400° C., for the subsequent processes. In addition the material should preferably be able to be applied by means of a spin-coating process and should have as high a thermal conductivity and thermal capacity as possible. Moreover, the internal stresses should be very low or should match those of the thinned wafer in order to prevent bending, since only a flat wafer can be worked in a fault-free manner in the existing devices. The layer thickness of the carrier layer should preferably be able to be adjusted so that the thickness that has been removed by the thinning of the wafer is compensated. If a sufficient evenness of the carrier layer cannot be achieved by the application method, then in addition a grinding or polishing method should also be employed in order to satisfy these conditions.

An object according to the invention is preferred in which the interlayer arranged on it has a thermal conductivity that is less than that of the wafer by at most 10%.

A high thermal conductivity of the interlayer is advantageous, since in particular with a rear side metallization of the wafer, especially if it has been thinned to a high degree, it is subjected to such a high thermal stress that parts of the electronic components in the active layer may be destroyed if an adequate dissipation of the heat is not ensured. If the interlayer and ideally also the carrier layer have appropriate thermal conductivity properties (and particularly preferably a high thermal capacity) then a reduction of the thermal stress within the active zone is guaranteed.

The application of the coating (carrier layer plus interlayer) may also take place on the rear side if this provides advantages, such as for example in handling or further processing.

The invention also provides a process for the production of a wafer with a carrier layer and an interlayer arranged between the carrier layer and the wafer, said process comprising the following steps:

a) supplying a wafer,
b) provision of the wafer with a plasmapolymeric interlayer so that this adheres to the wafer,
c) application of a carrier layer to the interlayer so that the interlayer adheres more firmly to the carrier layer than to the wafer, in which the front side of the wafer preferably contains an active layer with electronic components and the interlayer is arranged on the front side.

It is preferred in this connection if in step b) the interlayer is deposited on the wafer, the deposition conditions being varied with respect to time so that the interlayer that is formed is a gradient layer and/or comprises an adhesive zone for the application of the carrier layer and a dehesive zone adjacent to the wafer as well as optionally a transition zone.

Preferably in this connection the wafer is wetted before the step b) with a liquid precursor that in turn is preferably a separation-active substance, in order thereby to influence in a desired way the separation properties of the dehesive zone of the interlayer. In the process according to the invention it is preferred if the liquid precursor is applied to the wafer by means of dipping, spraying or a spincoating process. It is most particularly preferred if the process according to the invention in step b) is carried out so that the liquid precursor is crosslinked and becomes an integral constituent of the interlayer.

The invention also provides a process for the thinning of a wafer, comprising the following steps:
production of a wafer with a carrier layer and an interlayer arranged between the carrier layer and the wafer, according to an aforedescribed process according to the invention (preferably according to a process described for the second aspect of the invention), wherein in step a) a wafer to be thinned is supplied, and
thinning of the rear side of the wafer, as well as a process for metallizing the rear side of a wafer, comprising the following steps:
production and optionally thinning of a wafer with a carrier layer and an interlayer arranged between the carrier layer and the wafer, according to an aforedescribed process of the invention (preferably according to a process described for the second aspect of the invention) and
application of a metal layer to the rear side of the wafer.

The above comments apply as appropriate with respect to the preferred modifications.

The two last-mentioned processes according to the invention are simplified compared to corresponding processes from the prior art, and to be more precise particularly on account of the combination of the wafer with the re-peelable carrier layer and due to the properties (e.g. thermal conductivity) of the interlayer.

Preferably, with the two last-mentioned processes according to the invention the interlayer and the carrier layer are removed again from the wafer after the thinning and/or after the metallization of the rear side.

Processes according to the invention (preferably according to a process described for the second aspect of the invention) are preferred, in which a wafer prepared for the separation into individual elements is employed, in which again there preferably takes place a separation of the wafer—optionally with the exception of the rear side metallization—into individual elements, through the thinning or the removal of the interlayer and the carrier layer. In this connection it should be noted that undercuts on the surface of the wafer interfere in the separation process and are therefore preferably avoided.

Figure 16:
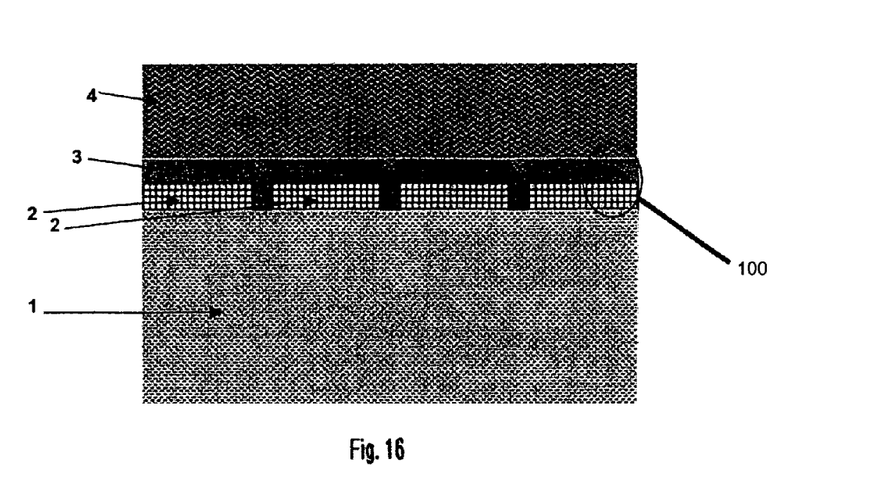
FIG. 16 shows diagrammatically a preferred object according to the invention (wafer plus carrier layer and interlayer).
Figure 17:
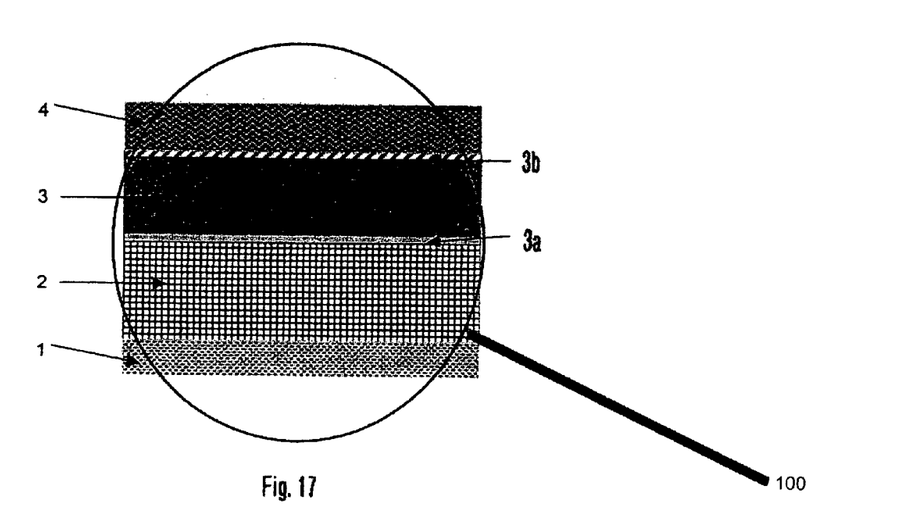
FIG. 17 is a detailed view of the region 100 identified with a magnifying glass in FIG. 16.

The second aspect of the invention is now described in more detail with the aid of examples and FIGS. 16 and 17:

FIG. 16 shows diagrammatically a preferred object according to the invention (wafer plus carrier layer and interlayer): it comprises a silicon layer 1 without electronic components, a layer 2 with electronic components, which is optionally also protected by a passivating layer, an interlayer 3 and a carrier layer 4.

FIG. 17 is a detailed view of the region 100 identified with a magnifying glass in FIG. 16: a small part of the silicon layer 1 without electronic components, the active layer 2 with electronic components, the interlayer 3 and a part of the carrier layer 4 are shown. Within the interlayer 3 the dehesive zone 3a and the adhesive zone 3b are highlighted.

Figure 1:
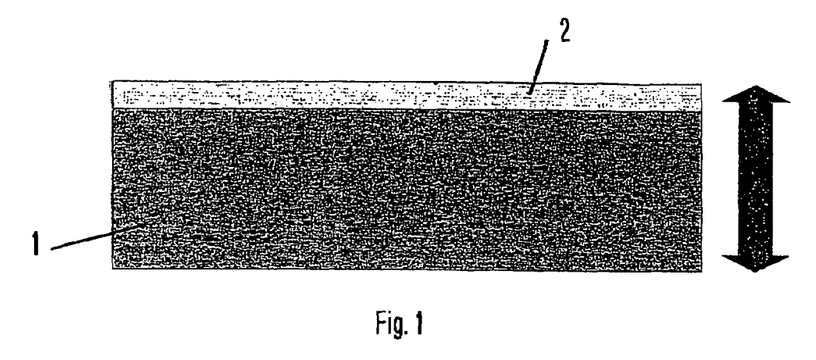
FIG. 1: step 1; the cross-section of a wafer (1, 2) with a zone 1 to be thinned and electronic components 2 and of original thickness of e.g. 600 µm (double arrow) is diagrammatically illustrated.
Figure 2:
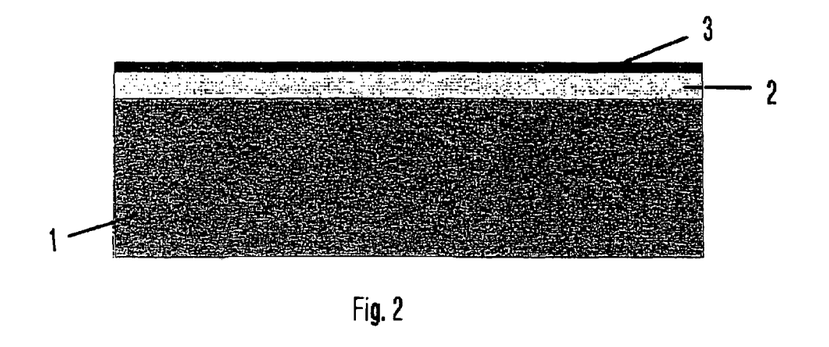
FIG. 2: a wafer after step 2, i.e. after the application of an interlayer 3, e.g. by means of CVD coating processes.
Figure 3:
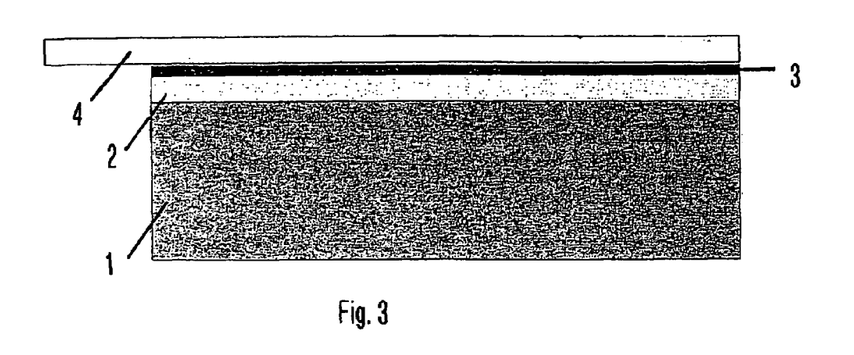
FIG. 3: a wafer after step 3, after the application of a carrier layer 4 by application of a plastics composition consisting for example of a polymer (e.g. polyamide). In this connection it may be advantageous to distribute and/or smooth the applied composition by means of suitable methods such as for example spincoating. Carrier layer 4 preferably provides protection for interlayer 3
Figure 4:
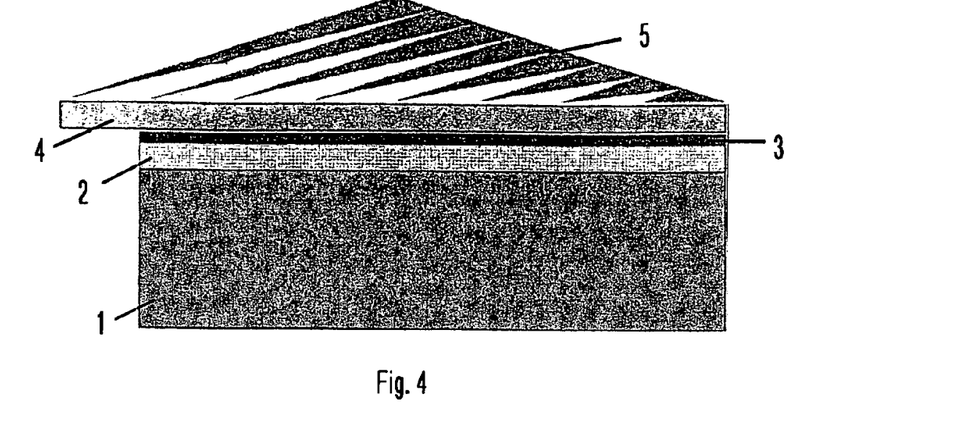
FIG. 4: step 4; the hardening and/or consolidation of the protective and carrier layer by thermal treatment (warming or heating) and/or by another suitable chemical and/or physical treatment 5 of the plastics composition.
Figure 5:
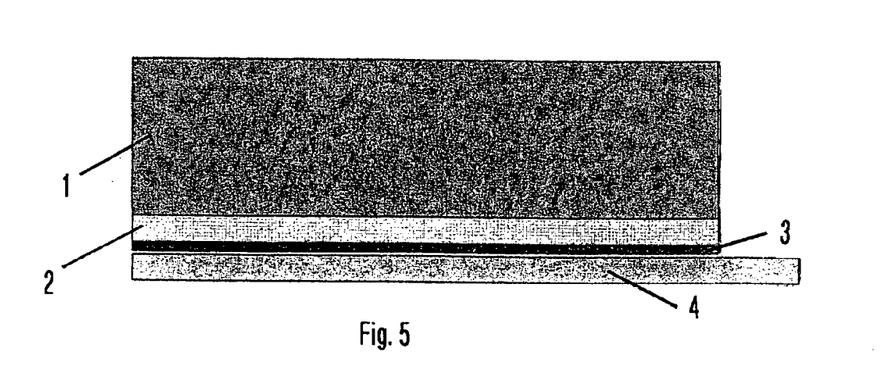
FIG. 5: shows a wafer rotated in step 5, i.e. the insertion into a mechanical device for the mechanical thinning (grinding and/or abrasion, etc.).
Figure 6:
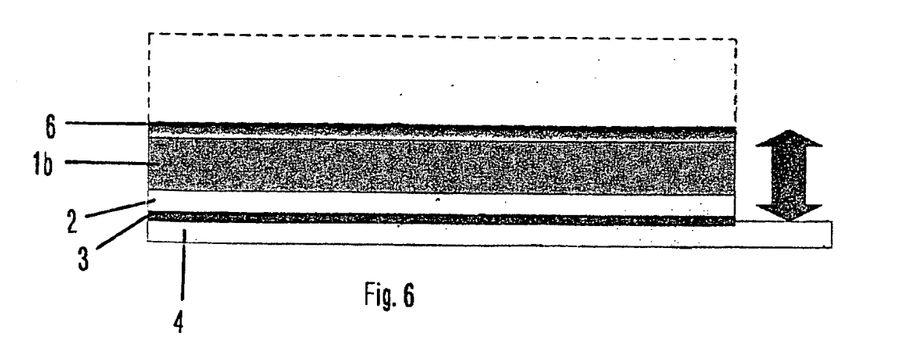
FIG. 6: the state after step 6 (grinding/smoothing); the cross-section of a thinned wafer 1b, 2 with an already thinned zone 1b is illustrated diagrammatically. A zone 6 damaged by the thinning procedure is situated on the rear side. The remaining wafer thickness of for example 100 µm is indicated by a double arrow, and the effected abrasion of the rear side of the wafer is indicated by dotted lines.
Figure 7:
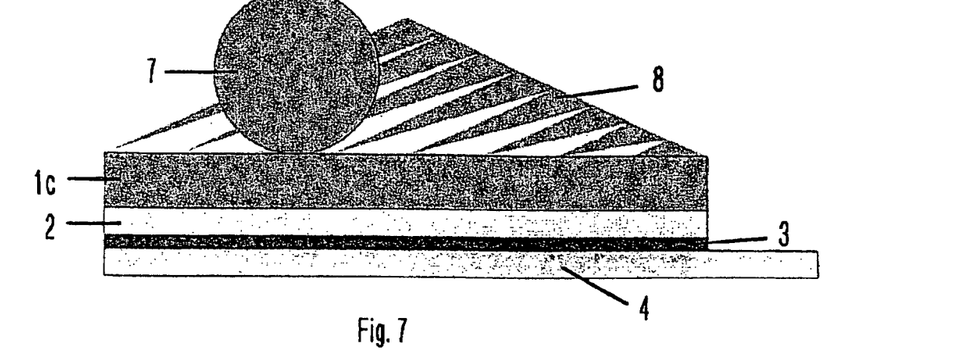
FIG. 7: step 7; the removal of the damaged zone 6 by means of mechanical processes such as for example polishing 7 and/or by chemical processes such as for example etching 8 of the rear side, so that the wafer 1c, 2 now has a zone 1c that is thinned even further.
Figure 8:
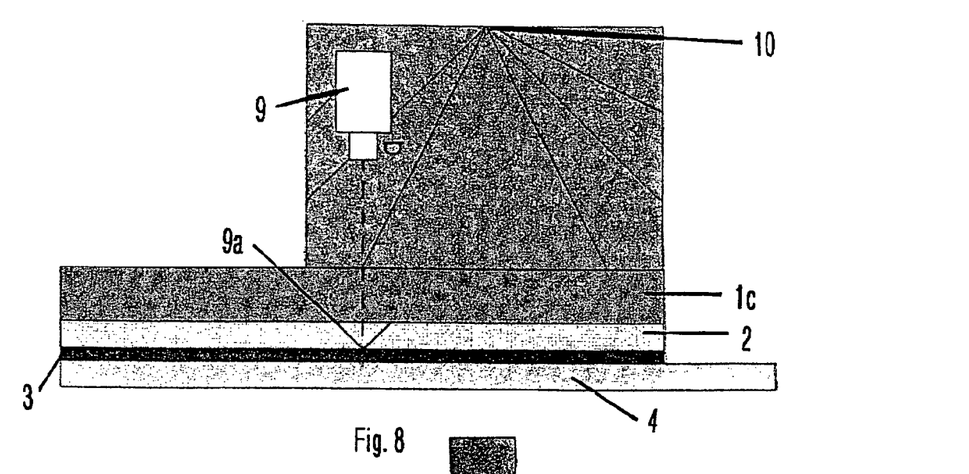
FIG. 8: step 8; the straightening of a wafer by means of optical processes. In particular it may be advantageous in this case to transilluminate the wafer by means of light of a suitable wavelength (for example IR radiation, IR radiation source 10), in order thereby to recognise the structures and/or markings 9a applied to the front side (active or structured side) of the wafer for the purposes of positioning the wafer and/or positioning the cutting device (for example the laser 11, cf.
Figure 9:
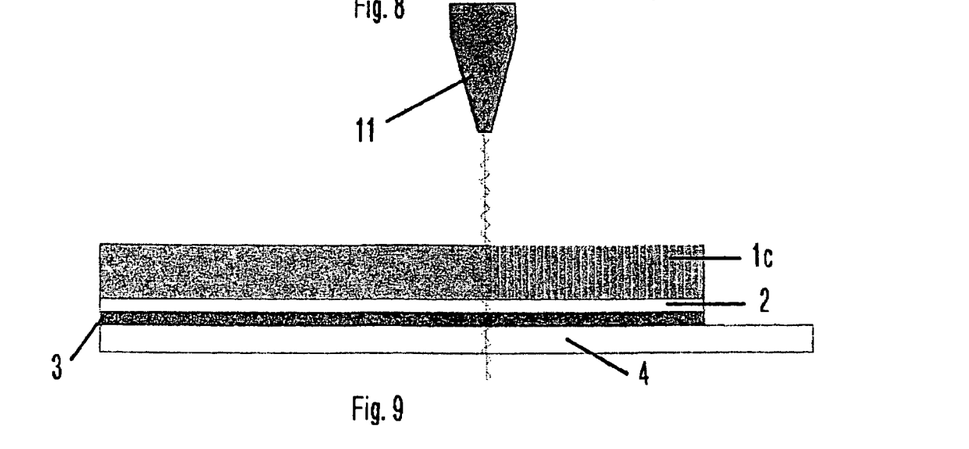
FIG. 9: step 9; the separation of a wafer by means of suitable cutting processes, in this case by means of a laser cutting head 11. In particular it may be advantageous to use in this connection a laser beam with/or without water jet assistance.
Figure 10:
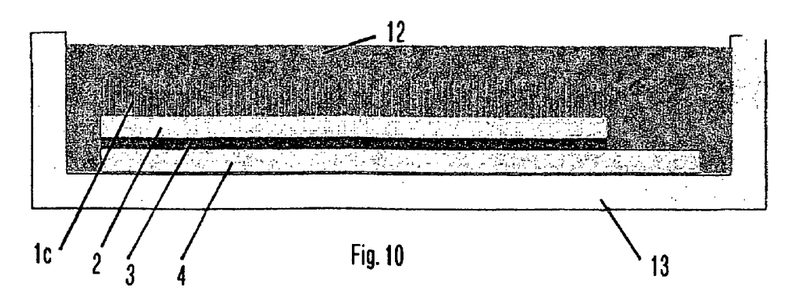
FIG. 10: step 10; (preferred but not obligatory), the cleaning of the wafer. For the purposes of cleaning it is advantageous to clean the wafer by means of suitable methods. In particular it may be advantageous to use in this connection liquid cleaning agents 12 such as e.g. water, by means of spraying and/or rinsing and/or by means of a bath 13. However, alternatively or in addition processes such as suctioning or blowing may also be used.
Figure 11:
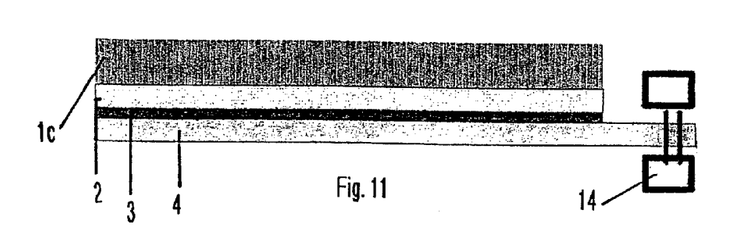
FIG. 11: step 11; the fixing of the wafer. In order to ensure a better fixing and holding of the wafer it may be advantageous and/or necessary to secure and/or fix the wafer (e.g. via its carrier layer 4) to a holder 14. This may also be achieved by employing a further holder and/or suitable methods such as bonding, static charging or similar methods. In principle the possibility of fixing and/or holding is envisaged for all fabrication steps described in the example, insofar as this is advantageous and/or necessary.
Figure 12:
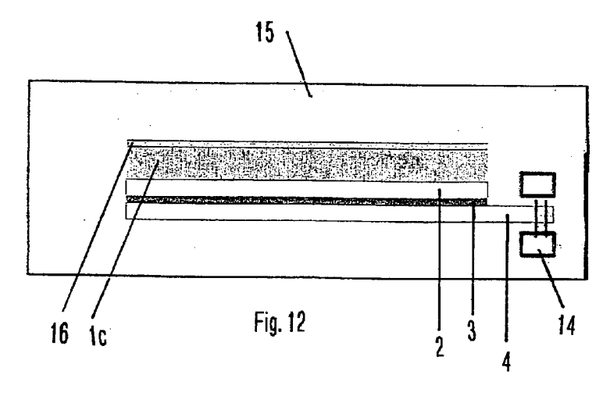
FIG. 12: step 12; the coating of the rear side. In order to apply a coating to the rear side of the wafer it may be advantageous and/or necessary to apply this in a vacuum 15. The coating 16 on the rear side may in this connection consist of a metallic layer that is applied by means of suitable methods such as for example vapour deposition and/or sputtering and/or by another suitable chemical and/or physical method.
Figure 13:
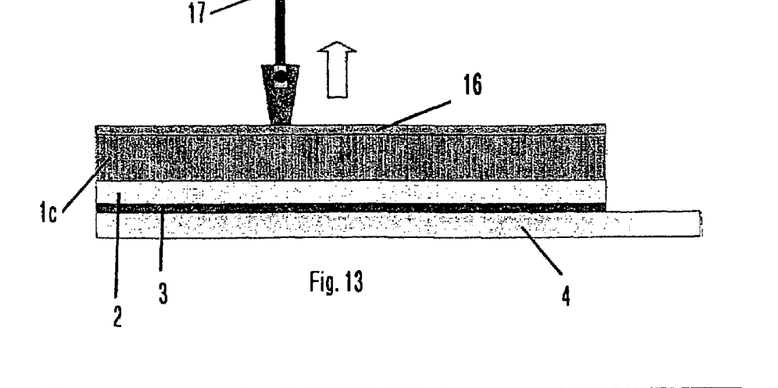
FIG. 13: step 13; the stripping or removal of the divided parts (elements) of the wafer by means of suitable methods and/or devices 17, e.g. a pick-up device. In this connection it may be advantageous and/or necessary to assist the stripping of the elements by suitable chemical and/or physical processes.
Figure 14:
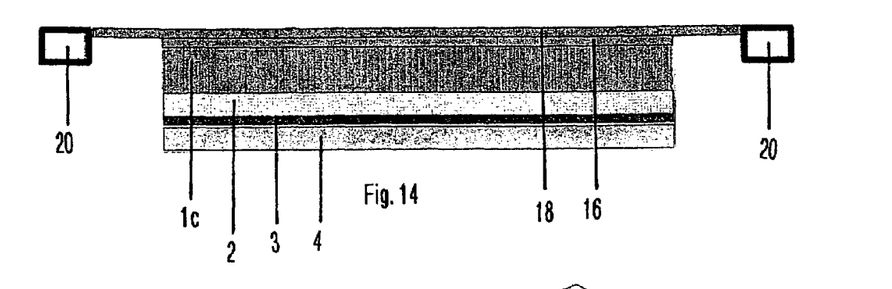
FIG. 14: an alternative to step 13: it may be advantageous and/or necessary to place and/or bond the wafer via its rear side on/to a second film and/or carrier (for example carrier films such as Blue Tape) 18, if necessary to fix the wafer by means of holding frames 20, as well as to rotate the wafer.
Figure 15:
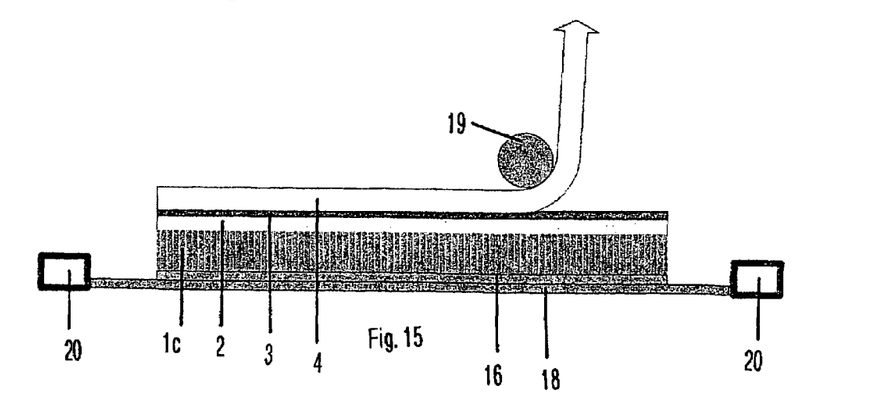

To fabricate the object according to the invention a silicon wafer (comprising the silicon layer 1 and layer 2 with electronic components) provided with electronic components and illustrated in FIGS. 1 and 2 is first of all provided with a plasmapolymeric interlayer 3. This interlayer is constructed so that it comprises the dehesive zone 3a facing the surface of the structural part and comprises the adhesive zone 3b facing outwardly. The region lying between these zones (cf. FIG. 2) forms a transition zone, which could also be dispensed with.

A thicker carrier layer 4 is then applied to the plasmapolymeric interlayer 3. This carrier layer may be applied for example via a spincoating method or by means of lacquering.

The structure of the adhesive zone 3b must in principle match the carrier layer 4 in order to produce a firmer bonding between the carrier layer 4 and adhesive zone 3b than between the dehesive zone 3a and the surface of the silicon wafer (consisting of layers 1 and 2). Preferably the carrier layer is applied in a thickness that corresponds to the thinning of the wafer in a subsequent work stage, in order thereby to allow the formation of uniform thickness relationships and permit a normal handling of the wafer.

EXAMPLE 3

Application of an Interlayer as Gradient Layer Using a Liquid Precursor

A linear polydimethylsiloxane of chain length 50 (AK 50, Wacker Chemie) was used as liquid precursor, which was applied in a layer thickness of 50 nm uniformly to a silicon wafer to be treated. In preliminary tests the material AK 50 exhibited a high resistance in vacuo. The prepared wafer was then introduced into a plasma polymerisation unit and coated further, employing the parameters listed in Table 1. In this connection the wafer was covered with an auxiliary device during part 1 of the coating procedure, which was removed at the start of part 2. The covering served to produce stable plasma and gas conditions before the wafer was exposed to the plasma. Typically, a transient phase in fact occurs at the start of a plasma process, which can have undesirable influences on the interface and/or on the liquid precursor (see also above).

TABLE 1

Parameters during deposition of the interlayer; total layer thickness ca. 280 nm

| | Gas 1 [sccm] | Gas 2 [sccm] | Gas 3 [sccm] | Output | Time | Pressure |
|---|---|---|---|---|---|---|
| | Gas type | | | | | |
| | HMDSO | $O_2$ | $H_2$ | [W] | [sec] | [mbar] |
| Part 1 | 70 | 24 | | 700 | 300 | 0.03 |
| Part 2 | 70 | 24 | | 700 | 300 | 0.03 |
| Part 3 | 70 | 32 | | 700 | 180 | 0.03 |
| Part 4 | 70 | 50 | | 700 | 180 | 0.03 |
| Part 5 | 60 | 50 | | 700 | 180 | 0.03 |
| Part 6 | 50 | 50 | | 700 | 180 | 0.03 |
| Part 7 | 35 | 75 | | 700 | 180 | 0.03 |
| Part 8 | 27 | 100 | | 700 | 180 | 0.03 |
| Part 9 | 27 | 100 | | 1500 | 180 | 0.031 |
| Part 10 | 27 | 100 | | 2500 | 60 | 0.031 |
| Part 11 | | 200 | 200 | 2000 | 60 | 0.04 |
| Part 12 | | 200 | 900 | 2000 | 300 | 0.05 |
| Part 13 | | 10000 | | 2500 | 300 | 0.22 |

Such a coating could be heat treated for 30 minutes at 400° C. without the dehesive properties of the coated wafer being lost.

After the application of a suitable carrier layer the whole interlayer could be stripped completely from the wafer surface. Confirmation of the residue-free removal was obtained by ellipsometry. Residues could no longer be detected using this very sensitive layer thickness measurement process. The stripping forces of the dehesion coating were not affected by the aforedescribed heat treatment process. The plane of separation was always on the wafer side. (Note: on blank wafers this can easily be optically monitored if the interlayer is applied in such a layer thickness that interference colours are produced. In addition the wetting angle measurement can also demonstrate for a relatively large lateral region that no residues of the dehesion layer remain on the wafer surface).

EXAMPLE 4

Application of an Interlayer Thinner than the Gradient Layer Using a Liquid Precursor Procedure as in Example 3; parameters, see Table 2.

TABLE 2

Parameters during deposition of the interlayer; total layer thickness: ca 160 nm

| | Gas 1 [sccm] | Gas 2 [sccm] | Gas 3 [sccm] | Output | Time | Pressure |
|---|---|---|---|---|---|---|
| | Gas type | | | | | |
| | HMDSO | $O_2$ | $H_2$ | [W] | [sec] | [mbar] |
| Part 1 | 70 | 24 | | 700 | 900 | 0.03 |
| Part 2 | 70 | 24 | | 700 | 1800 | 0.03 |
| Part 3 | | 200 | 900 | 1600 | 180 | 0.05 |
| Part 4 | | 10000 | | 2500 | 120 | 0.22 |

The invention claimed is:

1. Wafer (1, 2; 1b, 2; 1c, 2) exhibiting a front side and a rear side, said wafer comprising a carrier layer (4) and an interlayer (3) arranged between a carrier layer (4) and a wafer, characterised in that the interlayer (3) is a plasmapolymeric layer that adheres to the wafer (1, 2; 1b, 2; 1c, 2) and adheres more firmly to the carrier layer (4) than to the wafer.

2. Wafer (1, 2; 1b, 2; 1c, 2) according to claim 1, in which the wafer (1, 2; 1b, 2; 1c, 2) consists essentially of silicon or doped silicon.

3. Wafer (1, 2; 1b, 2; 1c, 2) according to claim 1, in which the wafer (1, 2; 1b, 2; 1c, 2) comprises on its front side an active layer (2) with electronic components and the interlayer (3) is arranged on the front side.

4. Wafer (1, 2; 1b, 2; 1c, 2) according to claim 1, in which the interlayer (3) comprises an adhesive zone (3b) adjacent to the carrier layer (4) and a dehesive zone (3a) adjacent to the wafer (1, 2; 1b, 2; 1c, 2), in which the adhesive zone (3b) and the dehesive zone (3a) comprise different substances.

5. Wafer (1, 2; 1b, 2; 1c, 2) according to claim 1, in which the interlayer (3) includes on the wafer side a previously liquid precursor as an integral constituent.

6. Wafer (1, 2; 1b, 2; 1c, 2) according to one of claim 1, in which the interlayer (3) adheres to the wafer and to the carrier layer (4) at temperatures of up to at least 350° C.

7. Wafer (1, 2; 1b, 2; 1c, 2) according to claim 1, in which the interlayer (3) can be stripped in a substantially residue-free manner from the wafer.

8. Wafer (1, 2; 1b, 2; 1c, 2) according to claim 1, in which the interlayer (3) and the wafer can be mechanically detached.

9. Wafer (1, 2; 1b, 2; 1c, 2) according to claim 1, in which the carrier layer (4) comprises a polymeric material.

10. Wafer (1, 2; 1b, 2; 1c, 2) according to claim 1, in which the interlayer (3) has a thermal conductivity that is less than that of the wafer by at most 10%.

* * * * *

UNITED STATES PATENT AND TRADEMARK OFFICE
CERTIFICATE OF CORRECTION

PATENT NO.          : 7,482,249 B2                                       Page 1 of 1
APPLICATION NO. : 10/536725
DATED                   : January 27, 2009
INVENTOR(S)         : Andreas Jakob et al.

It is certified that error appears in the above-identified patent and that said Letters Patent is hereby corrected as shown below:

In column 10, line 4, delete the word "Oferriew" and insert --Overview--.

In column 22, claim 6, line 50, delete "one of".

Signed and Sealed this

Twelfth Day of October, 2010

David J. Kappos
*Director of the United States Patent and Trademark Office*